United States Patent
McIntosh et al.

(10) Patent No.: US 6,448,851 B1
(45) Date of Patent: Sep. 10, 2002

(54) AMPLIFIER WITH OFFSET COMPENSATION FOR A HIGH VOLTAGE OUTPUT TRANSISTOR STAGE

(75) Inventors: James Alexander McIntosh, Dallas, TX (US); Wayne Tien-Feng Chen, Plano, TX (US); Roy Clifton Jones, III, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/934,183

(22) Filed: Aug. 21, 2001

(51) Int. Cl.[7] .................................................. H03K 3/12
(52) U.S. Cl. ....................... 330/207 A; 330/9; 330/251; 327/307; 327/336
(58) Field of Search ........................... 330/9, 207 A, 330/251; 327/307, 333, 336, 341, 344, 345

(56) References Cited

U.S. PATENT DOCUMENTS

| | | | |
|---|---|---|---|
| 4,377,759 A | * | 3/1983 | Ohhata et al. ............... 327/307 |
| 4,949,048 A | * | 8/1990 | Tokumo et al. .............. 330/251 |
| 5,642,070 A | * | 6/1997 | Furukawa .................... 327/307 |
| 6,121,831 A | * | 9/2000 | Mack .......................... 327/307 |

* cited by examiner

*Primary Examiner*—Terry D. Cunningham
*Assistant Examiner*—Long Nguyen
(74) *Attorney, Agent, or Firm*—Bret J. Petersen; Frederick J. Telecky, Jr.

(57) ABSTRACT

A high voltage output stage amplifier that maximizes the output voltage swing when the peak-to-peak output voltage signal is higher than the supply voltage used in the signal conditioning circuits of the amplifier. The amplifier allows the maximum peak-to-peak swing on the output stage by shifting the quiescent voltage of the output stage to the midpoint of the output supply voltage. The shift is accomplished by tapping an offset current at the input of the error integrating stage of the amplifier proportional to the difference in the two power supply voltages.

13 Claims, 3 Drawing Sheets

AMPLIFIER WITH OFFSET COMPENSATION FOR A HIGH VOLTAGE OUTPUT TRANSISTOR STAGE

FIELD OF THE INVENTION

This invention generally relates to output amplifiers such as those used for audio systems and other power applications. More particularly, it relates to offset compensation for an amplifier with a high voltage output stage and lower voltage conditioning circuits.

BACKGROUND OF THE INVENTION

In many amplifier applications, the amplifier output stage is required to provide AC peak-to-peak load voltage signals that are higher than the supply voltage used for the signal conditioning sections of the amplifier. Operating the signal conditioning circuits at the lower voltage enables a more efficient, lower power and lower cost amplifier. However, a higher voltage is required to drive external components such as speakers in audio applications from a separate higher voltage supply.

Using a prior art circuit having error correction feedback for powering output transistors at a different supply voltage from the conditioning stages results in a lower maximum peak-to-peak voltage output than theoretically possible from the higher voltage supply. FIG. 1 a shows a prior art amplifier circuit, having an output stage 10 with a Vdd supply, and conditioning circuit 20 with a Vcc supply. In this circuit, when no input signal is present, $I_2$ is equal to $I_1$, which is equal to zero. Thus, the output quiescent point is Vcc/2. With the quiescent point at Vcc/2, the output signal is clipped at the bottom of the output signal as shown in FIG. 1b.

SUMMARY OF THE INVENTION

The present invention maximizes the output voltage swing on a high voltage output stage amplifier where the peak-to-peak output voltage signal is higher than the supply voltage used in the signal conditioning circuits of the amplifier. The amplifier allows the maximum peak-to-peak swing on the output stage by shifting the quiescent voltage of the output stage to the midpoint of the output supply voltage. The shift is accomplished by tapping an offset current at the input of the error integrating stage of the amplifier proportional to the difference in the two power supply voltages.

In an embodiment of the present invention a feedback resistor is connected between the output of the high voltage stage and the negative input of the error integrating circuit such that an offset current circuit sinks a current through the feedback resistor to hold the quiescent point of the output stage output to one-half Vdd.

In another embodiment of the present invention the offset current circuit provides a current of $(Vdd/2-Vcc/2)/R_F$, where Vdd is the first supply voltage, Vcc is the second supply voltage, and $R_F$ is the feedback resistor.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1b Shows a the output voltage for the prior art amplifier in FIG. 1a.

DETAILED DESCRIPTION OF THE PREFERRED EMBODIMENTS

The preferred embodiment of the present invention is best understood by referring to FIGS. 1–5 of the drawings, where like numerals are used for like and corresponding parts of the various drawings.

Figure 1A:
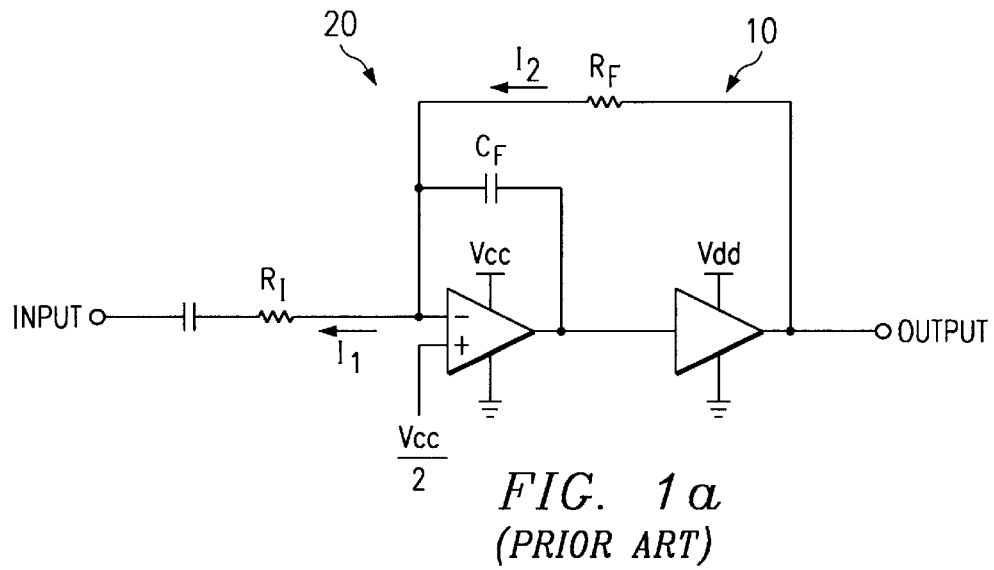
FIG. 1a Shows the schematic of a prior art amplifier with feedback.
Figure 1B:
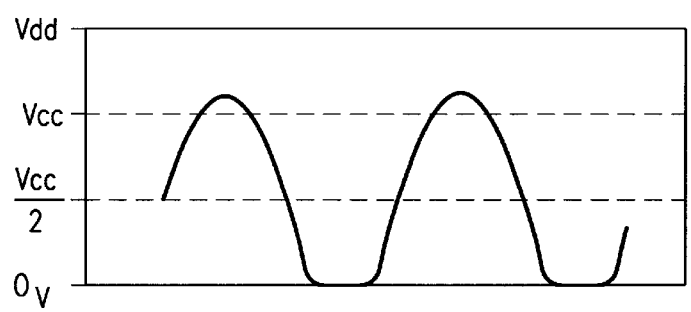
Figure 2:
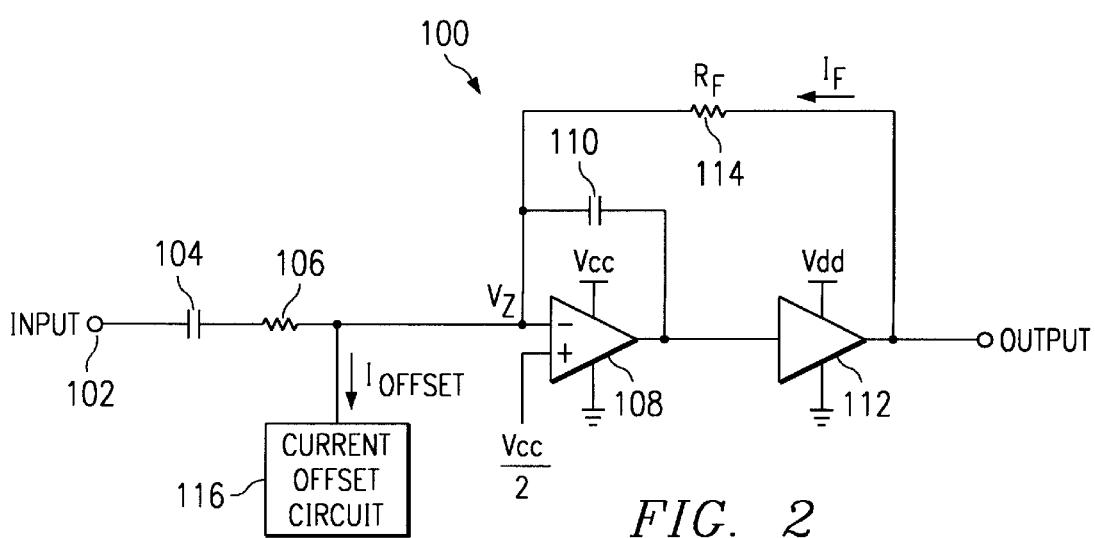
FIG. 2 Illustrates an amplifier circuit according to an embodiment of the present invention.

With reference to FIG. 2, there is shown a schematic diagram of an amplifier 100 that embodies the present invention. The amplifier 100 has an input 102 connected to a blocking capacitor 104. The blocking capacitor's opposite terminal is connected to the first terminal of an input resistor 106. The input resistor's second terminal is connected to the negative input of amplifier 108. This input of the amplifier is node Z having a voltage of $V_z$. The other input to the amplifier 108 connected to a fixed voltage of Vcc/2, and the source terminals of the amplifier are connected to Vcc and ground. An error integrating capacitor 110 is connected from the output to the negative input of amplifier 108. The output of amplifier 108 is connected to the input of the high voltage output drive stage 112. The source terminals of the high voltage output drive stage 112 are connected to Vdd and ground, where Vdd is a higher voltage than Vcc. The output of this stage drives the circuit output and has a feedback path through resistor $R_F$ 114 to the negative input of amplifier 108.

Again referring to FIG. 2, the negative input of amplifier 108 is also connected to a current offset circuit 116, which is the essential difference between this circuit and the prior art amplifier circuit described above. The offset current supplied by this circuit is used to shift the quiescent point of the amplifier to Vdd/2. The current needed for a quiescent output of Vdd/2 is determined as follows:

With no input signal present, $I_F = I_{offset}$, and $V_z = Vcc/2$, then $$Vout = Vcc/2 + I_{offset} \times R_F$$

Setting output voltage to Vdd/2 and solving for $I_{offset}$ $$I_{offset} = (Vdd/2 - Vcc/2)/R_F$$

Any circuit which can supply this offset current can be substituted for the current offset circuit block 116 shown in FIG. 2. Embodiments of the present invention anticipate this circuit block containing bipolar and/or MOS transistors.

Figure 3:
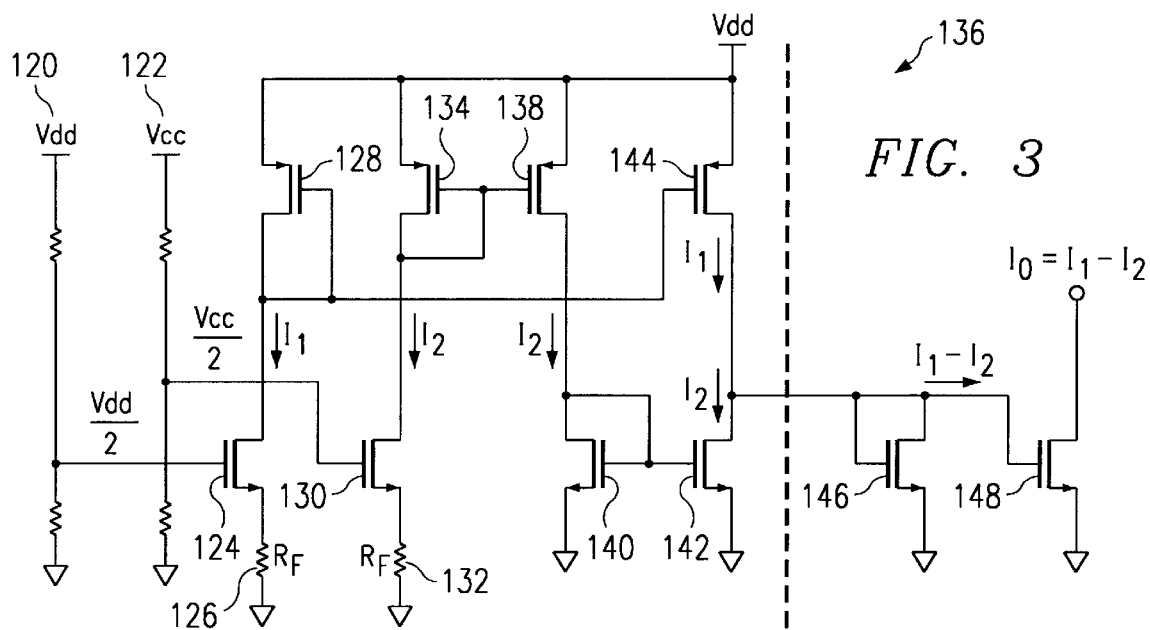
FIG. 3 Illustrates a current offset circuit for an amplifier circuit according to an embodiment of the present invention.

With reference to FIG. 3, there is shown a specific schematic diagram for a current offset circuit according to an embodiment of the present invention. This circuit can substitute for the current offset circuit block 116 shown in FIG. 2. As described above, the value of current needed to set the quiescent voltage of the amplifier to Vdd/2 is: $I_{offset}=(Vdd/2-Vcc/2)/R_F$. The circuit shown in FIG. 3 provides a current as follows:

$$I_o = I_1 - I_2 = (Vdd/2 - V_T)/R_F - (Vcc/2 - V_T)/R_F - (Vdd/2 - Vcc/2)/R_F$$

The circuit of FIG. 3 provides the above offset current by first producing Vdd/2 and Vcc/2 with voltage divider circuits 120 and 122 respectively. The voltage dividers in this embodiment have two resistors connected between the source voltages and ground. Since the resistors of each divider circuit are equal, the midpoint of each voltage divider supplies ½ the voltage to the gate of a current mirror circuit. Voltage divider 120 supplies Vdd/2 to the gate of NMOS transistor 124. The source of transistor 124 is connected to resistor 126 having a resistance equal to resistor 114 ($R_F$) shown in FIG. 2. The drain of transistor 124 is connected to the source of NMOS transistor 128. Transistor 128 has its drain connected to Vdd and the gate connected to the source. The current $I_1$ flowing into the drain of transistor 124 is then (Vdd/2-$V_T$)/$R_F$, where $V_T$ is the gate-source voltage of transistor 124. Similarly, Voltage divider 122 supplies Vcc/2 to the gate of NMOS transistor 130. The source of transistor 130 is connected to resistor 134 having a resistance equal to resistor 114 ($R_F$) shown in FIG. 2. The drain of transistor 130 is connected to the source of NMOS transistor 132. Transistor 132 has its drain connected to Vdd and the gate connected to the source. The current $I_2$ flowing into the drain of transistor 124 is then (Vcc/2-$V_T$)/$R_F$, where $V_T$ is the gate-source voltage of transistor 124.

The desired offset current described above can now be obtained by taking the difference of currents $I_1$ and $I_2$ using difference circuit 136. The current in PMOS transistor 134 ($I_2$) is mirrored to PMOS transistor 138 with common gate connections. NMOS transistor 140 then mirrors current $I_2$ to transistor 142. In the same way, the current in PMOS transistor 128 ($I_1$) is mirrored to PMOS transistor 144 with common gate connections. The right leg of difference circuit 136 sinks a current $I_2$ through transistor 142 while drawing a current of $I_1$ from mirror transistor 144. The difference of the two currents flows through NMOS transistor 146, which has a gate and drain connected to the midpoint of transistors 142 and 144. The difference of the currents $I_1$ and $I_2$ is then mirrored to NMOS transistor 148 to provide the offset current sink to the circuit of FIG. 2.

Figure 4:
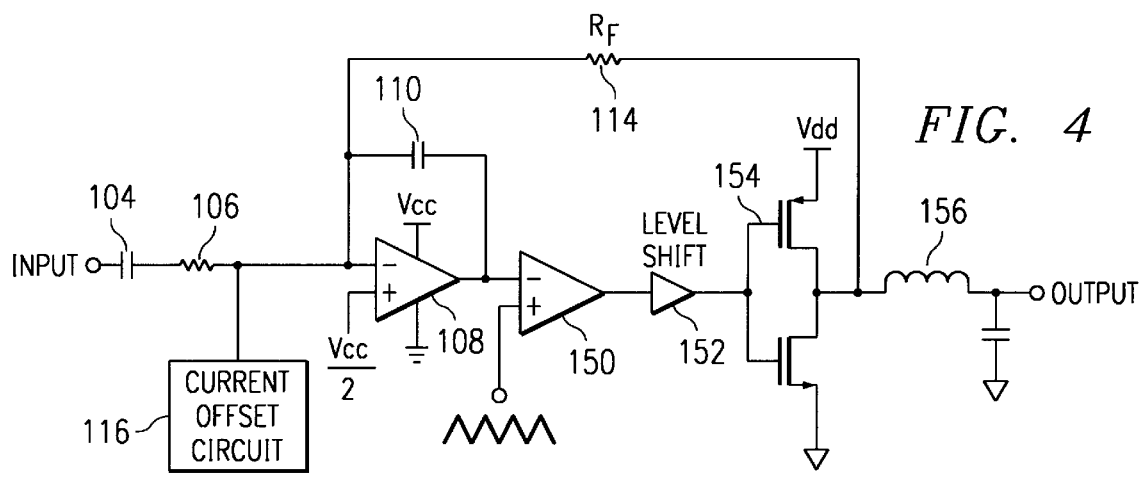
FIG. 4 Illustrates a current offset circuit for a class-D amplifier circuit according to an embodiment of the present invention.
Figure 5:
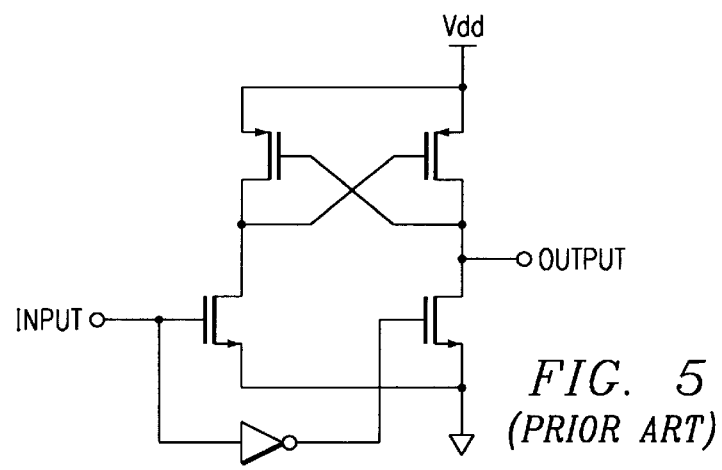
FIG. 5 Illustrates a level shift circuit for the class-D amplifier circuit in FIG. 4.

In the foregoing description, the amplifier described was a general case amplifier. Another embodiment of the present invention is a class-D amplifier as shown in FIG. 4 having the advantages and functionality of the general case amplifier described above. The class-D amplifier shown in FIG. 4 has the same input circuitry to amplifier 108 as shown in the previous embodiment. In this embodiment, the output of the amplifier 108 is connected to the negative input of ramp comparator 150. The positive input of ramp comparator 150 is a ramp input signal. This ramp input provides a comparison value for the ramp comparator to output a pulse modulated output to the output as is normal for a class-D amplifier. The output of ramp comparator 150 is applied to a level shift circuit 152. This circuit shifts the voltage range (Vcc) of the signal from the previous conditioning portions of the circuit to the output voltage range (Vdd). The output of the level shift is applied to the class-D output stage 154. The output stage then drives the amplifier output through an L-C filter 156. The L-C filter converts the pulse modulated signal back to an analog signal corresponding to the input signal for the amplifier. The output stage is an NMOS and a PMOS power transistor connected in parallel in the manner known in the prior art for class-D amplifiers. The level shift circuit is also as is known in the art; an example of the level shift circuit is shown in FIG. 5.

Figure 6:
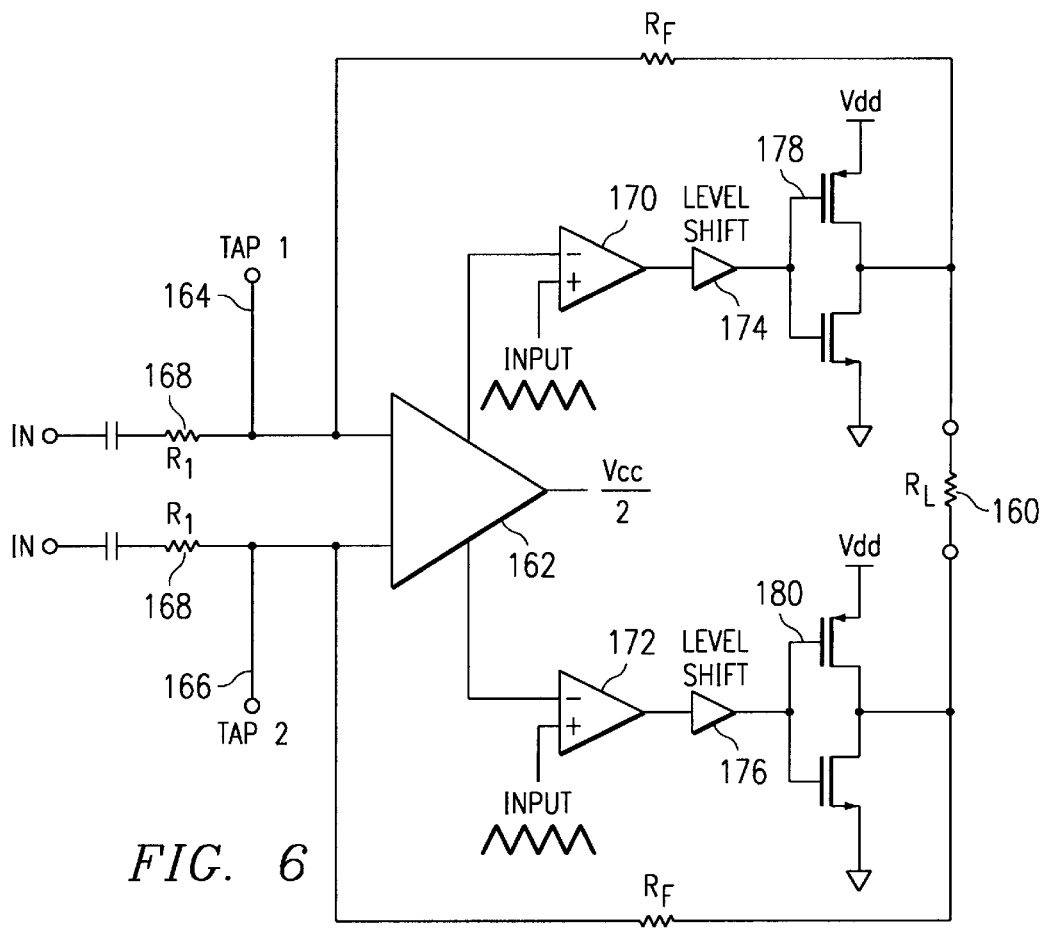
FIG. 6 Illustrates an embodiment of the present invention where the output is a bridge tied load.

FIG. 6 shows another embodiment according to the present invention; a differential amplifier design with a bridge tied load 160 output. In this embodiment, there are two signal inputs to the differential error integrating stage 162, thus requiring two current offset source inputs 164, 166 at Tap1 and Tap2. The circuit operates essentially the same as that shown in FIG. 4. In this case, the input is a differential input to the error integrating stage 162. In the illustrated embodiment, each input is through an input capacitor in series with a resistor R1 168. The differential error integrating stage 162 in this embodiment drives a differential output to the negative input of two ramp comparators 170, 172. As described above, the ramp comparator feeds a level shift circuit 174, 176. The level shift circuits drive a differential class-D output stage comprising two output stages 178, 180 as described above. The load RI is connected between the output drive stages 178, 180.

Figure 7:
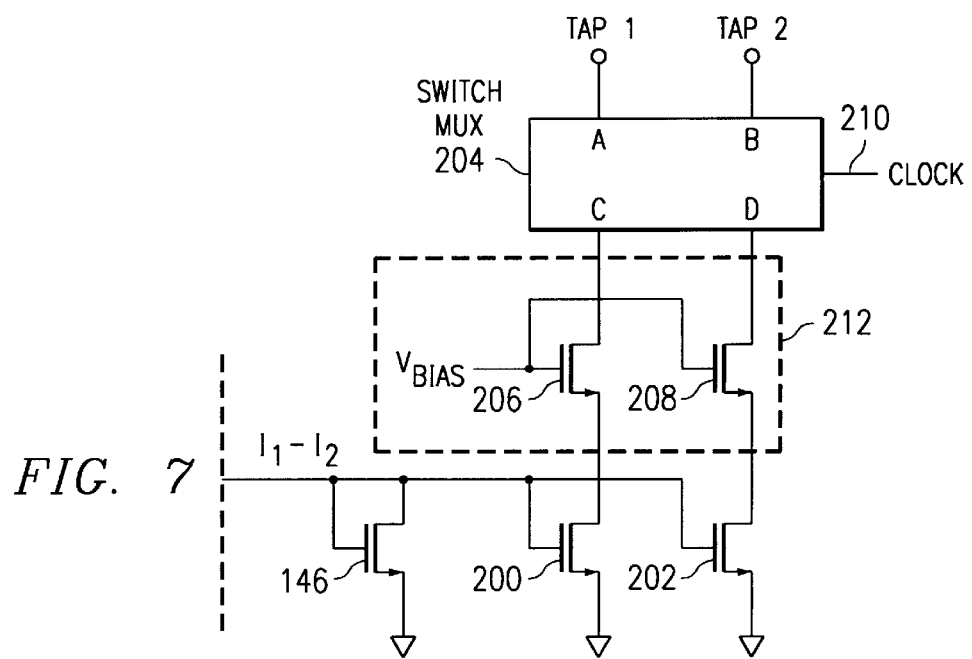
FIG. 7 Illustrates an offset current circuit for the amplifier circuit in FIG. 6.

FIG. 7 shows another embodiment according to the present invention. In amplifier designs with a clock signal that has a frequency higher than the input signal bandwidth, the two current sources can be switched between the two inputs using this clock source to remove any offset errors due to mismatch in the offset compensation circuit as shown in FIG. 7. The circuit shown in FIG. 7 has an input current of I1–I2 which could be from the circuit shown in FIG. 3. This input current is mirrored from transistor 146 to mirror transistors 200, 202. The mirror transistors sink a current through a switch multiplexor 204. The switch multiplexor 204 has a clock input 210 to switch inputs C and D to outputs A and B connected to Tap1 and Tap2 respectively. The multiplexor connects A to C and B to D when the clock input is high, and connects B to C and A to D when the clock input is low.

In the previous embodiment, where the error integrating stage is fully differential, cascode NMOS transistors shown in block 212 can be added to the current sources. The cascode transistor block 212 includes NMOS transistors 204, 206 with gates connected to a bias voltage, source connected to the switch multiplexer, and drains connected to the sources of current mirror transistors 200, 202 respectively. These transistors reduce the effect of the varying voltage values on the integrating amplifier inputs by holding the voltage across the drain-source of the current mirror transistors 200, 202 constant.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. Specifically, where the embodiments are described with MOS transistor technology, it is anticipated that other transistor technologies could implement the described functions, thus the specific transistor types and pin names should not be limited to the described embodiments.

What is claimed is:

1. An amplifier circuit comprising:
   a. a high voltage output stage with a first supply voltage and a peak-to-peak output voltage signal at an output;
   b. a signal conditioning stage having a second supply voltage lower than the first supply voltage, an input, and an output connected to the high voltage output stage, where the signal conditioning stage includes an error integrating circuit; and c. an offset current circuit connected to the input of the error integrating circuit of the amplifier, wherein the offset current circuit has a current proportional to the difference in the two power supply voltages.

2. The circuit of claim 1 further comprising a feedback resistor connected between the output of the output stage and the negative input of the error integrating circuit, wherein the offset current circuit sinks a current through the feedback resistor to hold the quiescent point of the output stage output to one-half the first voltage.

3. The circuit of claim 1 wherein the offset current circuit provides a current of $(Vdd/2-Vcc/2)/R_F$, where Vdd is the first supply voltage, Vcc is the second supply voltage, and $R_F$ is the feedback resistor.

4. The circuit of claim 2 wherein the offset current circuit provides a current of $(Vdd/2-Vcc/2)/R_F$, where Vdd is the first supply voltage, Vcc is the second supply voltage, and $R_F$ is the feedback resistor.

5. An class-D amplifier circuit comprising:
   a. a high voltage output stage with a first supply voltage and a peak-to-peak output voltage signal at an output;
   b. a signal conditioning stage having a second supply voltage lower than the first supply voltage, an input, and an output connected to the high voltage output stage, where the signal conditioning stage includes an error integrating circuit connected to a ramp comparator;
   c. a level shift circuit connect to the ramp comparator to shift the voltage level of the ramp comparator to the first- supply voltage;
   d. a feedback resistor connected between the output of the output stage and the negative input of the error integrating circuit; and
   e. an offset current circuit connected to the input of the error integrating circuit of the amplifier, wherein the offset current circuit sinks a current proportional to the difference in the two power supply voltages through the feedback resistor to hold the quiescent point of the output stage output to one-half the first voltage.

6. The circuit of claim 5 further comprising a feedback resistor connected between the output of the output stage and the negative input of the error integrating circuit, wherein the offset current circuit sinks a current through the feedback resistor to hold the quiescent point of the output stage output to one-half the first voltage.

7. The circuit of claim 5 wherein the offset current circuit provides a current through the feedback resistor to hold the quiescent point of the output stage output to one-half the first voltage, and the value of the current is $(Vdd/2-Vcc/2)/R_F$, where Vdd is the first supply voltage, Vcc is the second supply voltage, and $R_F$ is the feedback resistor.

8. A differential amplifier circuit comprising:
   a. a differential high voltage output stage with a first supply voltage and a peak-to-peak output voltage signal driving a bridge tied load between two output terminals;
   b. a signal conditioning stage comprising a second supply voltage lower than the first supply voltage, two inputs, and two outputs connected to the differential high voltage output stage, where the signal conditioning stage includes an error integrating circuit;
   c. a feedback resistor connected between each output terminal of the output stage and the inputs of the error integrating circuit; and
   d. an offset current circuit connected to the input of the error integrating circuit of the amplifier, wherein the offset current circuit sinks a current proportional to the difference in the two power supply voltages through the feedback resistor to hold the quiescent point of the output stage output to one-half the first voltage.

9. The circuit of claim 8 wherein the offset current circuit provides a current of $(Vdd/2-Vcc/2)/R_F$, where Vdd is the first supply voltage, Vcc is the second supply voltage, and $R_F$ is the feedback resistor.

10. The circuit of claim 9 wherein the offset current circuit further comprises a switch multiplexer to switch two offset current sources alternatively to the two inputs of the signal conditioning stage.

11. The circuit of claim 10 wherein the offset current circuit further comprises a cascode transistor between the offset current source and the switch multiplexer.

12. The circuit of claim 8 wherein the offset current circuit further comprises a switch multiplexer to switch two offset current sources alternatively to the two inputs of the signal conditioning stage.

13. The circuit of claim 12 wherein the offset current circuit further comprises a cascode transistor between the offset current source and the switch multiplexer.

* * * * *